(12) United States Patent
Morimitsu et al.

(10) Patent No.: US 7,198,447 B2
(45) Date of Patent: Apr. 3, 2007

(54) SEMICONDUCTOR DEVICE PRODUCING APPARATUS AND PRODUCING METHOD OF SEMICONDUCTOR DEVICE

(75) Inventors: Kazuhiro Morimitsu, Toyama (JP); Tatsuhisa Matsunaga, Fujisawa (JP); Masanori Kaneko, Tokorozawa (JP); Kouichi Noto, Yokohama (JP); Hidehiro Yanagawa, Toyama (JP); Masaki Matsushima, Ohme (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/360,597

(22) Filed: Feb. 6, 2003

(65) Prior Publication Data

US 2004/0052618 A1 Mar. 18, 2004

(30) Foreign Application Priority Data

Sep. 12, 2002 (JP) ............................. 2002-266585

(51) Int. Cl.
*H01L 21/677* (2006.01)
*B65B 21/02* (2006.01)
*B65B 69/00* (2006.01)
*B65G 65/34* (2006.01)

(52) U.S. Cl. ............ 414/217; 414/416.03; 414/416.08; 414/937; 414/939; 414/811

(58) Field of Classification Search ................. 414/217, 414/416.03, 416.08, 937, 939, 152, 160, 414/811

See application file for complete search history.

(56) References Cited

U.S. PATENT DOCUMENTS

| | | | | |
|---|---|---|---|---|
| 3,749,383 A | * | 7/1973 | Voigt et al. ................. | 266/249 |
| 4,770,590 A | * | 9/1988 | Hugues et al. ............... | 414/172 |
| 5,112,641 A | * | 5/1992 | Harada et al. .............. | 438/542 |
| 5,464,313 A | * | 11/1995 | Ohsawa ....................... | 414/172 |
| 5,562,383 A | * | 10/1996 | Iwai et al. ................ | 414/217.1 |
| 5,565,034 A | * | 10/1996 | Nanbu et al. ................ | 118/668 |
| 5,779,799 A | * | 7/1998 | Davis .......................... | 118/663 |
| 5,810,538 A | * | 9/1998 | Ozawa et al. ................ | 414/217 |
| 5,829,939 A | * | 11/1998 | Iwai et al. ................... | 414/411 |
| 5,829,969 A | * | 11/1998 | Miyashita et al. .......... | 432/253 |

(Continued)

FOREIGN PATENT DOCUMENTS

| | | |
|---|---|---|
| JP | 58-075840 | 5/1983 |
| JP | 2681055 | 8/1997 |
| JP | 2002043388 A * | 2/2002 |

*Primary Examiner*—Dean J. Kramer
*Assistant Examiner*—Greg Adams
(74) *Attorney, Agent, or Firm*—Hogan & Hartson LLP

(57) ABSTRACT

A semiconductor device producing apparatus is disclosed. The apparatus includes a carrier-holding stage for placing a carrier; first, second and third stages each for holding first and second boats one at a time, each boat holding one or more substrates; a boat transfer mechanism for transferring the boats among the first, second and third stages; and a substrate transfer mechanism for transferring the substrate(s) from the carrier to the boat held by the first stage. A controller controls the first stage, the boat transfer mechanism and the substrate transfer mechanism so that the boat transfer mechanism transfers one of the boats from the second stage to the first stage, the substrate transfer mechanism then transfers the substrate(s) from the carrier to the boat held by the first stage, and the first stage then moves the boat into the processing chamber for processing.

11 Claims, 8 Drawing Sheets

U.S. PATENT DOCUMENTS

| | | | |
|---|---|---|---|
| 5,839,870 A * | 11/1998 | Niemirowski et al. | 414/150 |
| 5,984,607 A * | 11/1999 | Oosawa et al. | 414/222.06 |
| 6,092,980 A * | 7/2000 | Kumasaka et al. | 414/804 |
| 6,143,040 A * | 11/2000 | Tometsuka et al. | 29/25.01 |
| 6,244,422 B1 * | 6/2001 | Bai | 198/464.4 |
| 6,327,794 B2 * | 12/2001 | Ishii | 34/408 |
| 6,332,898 B1 * | 12/2001 | Tometsuka et al. | 29/25.01 |
| 6,390,754 B2 * | 5/2002 | Yamaga et al. | 414/217 |
| 6,607,602 B1 * | 8/2003 | Granneman et al. | 118/719 |
| 6,911,112 B2 * | 6/2005 | An | 156/345.31 |
| 2001/0014267 A1 * | 8/2001 | Yamaga et al. | 414/217 |
| 2001/0016307 A1 * | 8/2001 | Ishii | 432/239 |
| 2002/0037210 A1 * | 3/2002 | Matsunaga et al. | 414/416.08 |

\* cited by examiner

F I G . 3
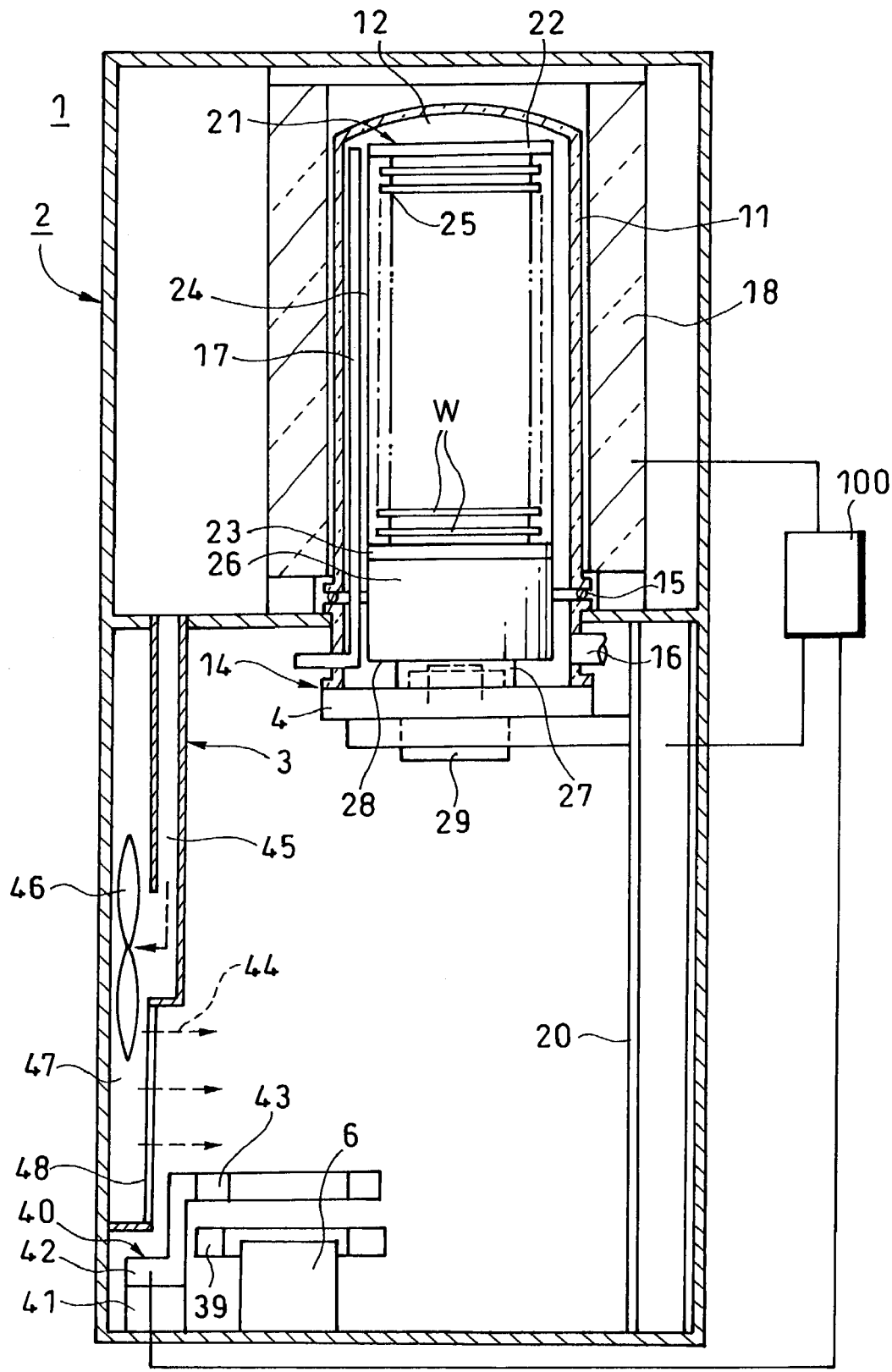

F I G. 5
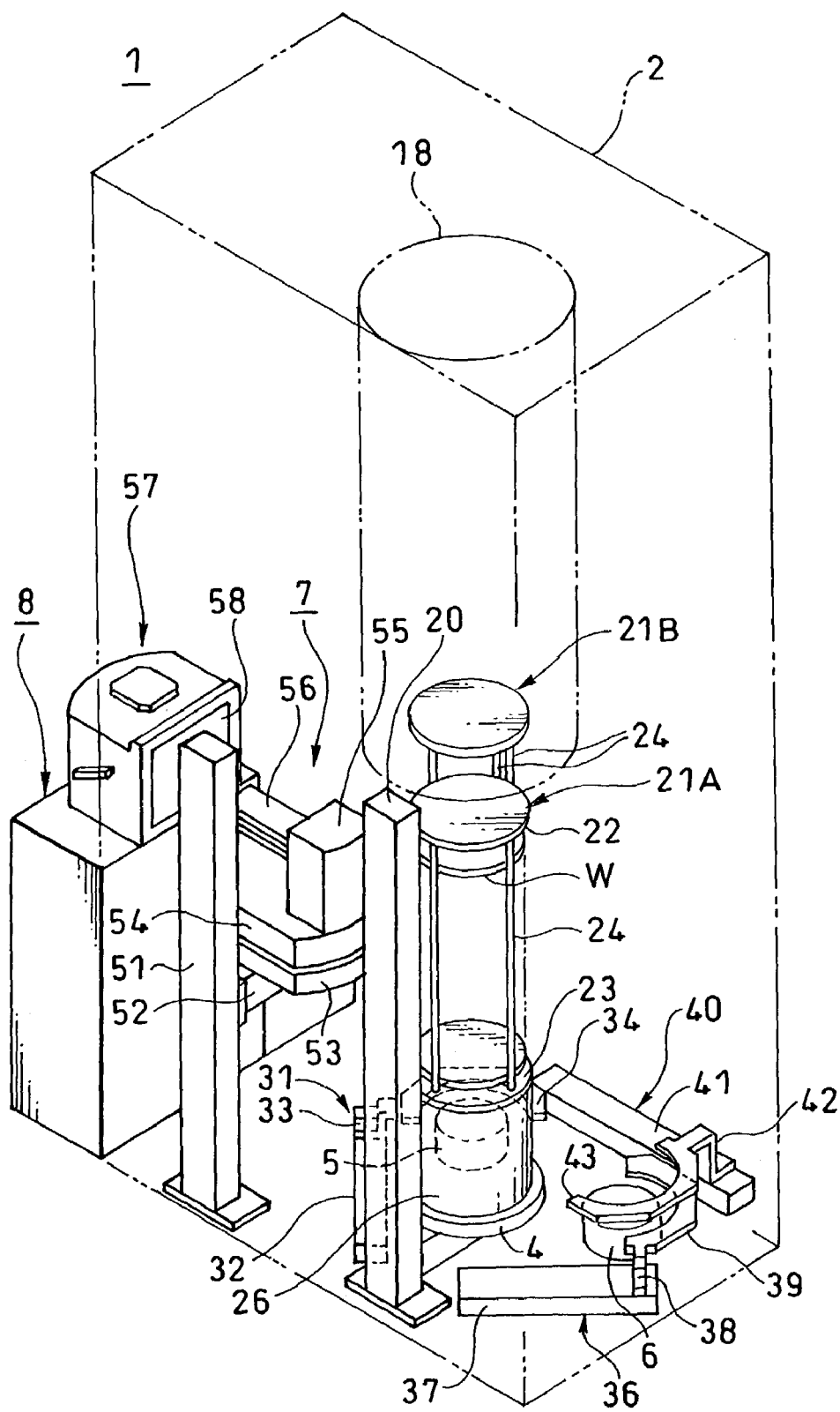

SEMICONDUCTOR DEVICE PRODUCING APPARATUS AND PRODUCING METHOD OF SEMICONDUCTOR DEVICE

BACKGROUND OF THE INVENTION

1. Field of the Invention

The present invention relates to a semiconductor device producing apparatus and a producing method of a semiconductor device, and more particularly, to a semiconductor device producing apparatus and a producing method of a semiconductor device which are effectively utilized for subjecting a semiconductor wafer or semiconductor wafers to thermal processing such as annealing processing, oxide film-forming processing, diffusion processing and film-forming processing.

2. Description of the Related Art

Generally, in a producing method of a semiconductor device, a batch-type vertical hot wall thermal processing apparatus (thermal processing apparatus, hereinafter) is widely used for subjecting a semiconductor wafer (wafer, hereinafter) into which an integrated circuit including a semiconductor element is incorporated to thermal processing such as annealing processing, oxide film-forming processing, diffusion processing and film-forming processing.

There exists a conventional thermal processing apparatus of this kind as described in Japanese Patent No. 2681055. In this thermal processing apparatus, a boat exchanging apparatus is disposed between a wafer transfer apparatus and a space directly below a process tube, a pair of (two) boats are placed on a rotating table of the boat exchanging apparatus, the pair of boats are rotated by 180 (around the rotating table so that an unprocessed boat and a processed boat are exchanged. That is, in this thermal processing apparatus, while one of the boats (first boat) holding a group of wafers is processed in a processing chamber of the process tube, new wafers are transferred to the other boat (second boat) by a wafer transfer apparatus.

Generally, film-forming processing time of the thermal processing apparatus is one to two hours although the time differs depending upon the kind of film to be processed by the thermal processing apparatus. On the other hand, time required for transferring 150 new wafers to the boat by the wafer transfer apparatus is about 12 minutes. In the above-described thermal processing apparatus, a group of new wafers are on standby outside of the processing chamber for a long time as long as one to two hours until the processing of the first boat is completed. If the group of new wafers transferred to the second boat is exposed to atmosphere outside the processing chamber, an unintended oxide film (natural oxide film, hereinafter) in terms of control is adversely formed on a surface of the wafer by moisture and oxygen existing in atmosphere. This natural oxide film exerts an adverse effect on variation of film-thickness processed by a wafer, or increases a contact resistance. Therefore, the natural oxide film exerts an effect on enhancement of packing density of a circuit, a quality (precision, lifetime and the like), performance (computation speed and the like) and reliability of a semiconductor integrated circuit apparatus (IC, hereinafter) produced by the wafer.

SUMMARY OF THE INVENTION

It is, therefore, a main object of the present invention to provide a semiconductor device producing apparatus and a producing method of a semiconductor device which are capable of shortening a standby time required until a substrate or substrates are transferred into a processing chamber to prevent natural oxide film or films from being generated on the substrate or the substrates According to a first aspect of the present invention, there is provided a semiconductor device producing apparatus, comprising:

a carrier-holding stage at which a carrier is to be placed which accommodates a substrate or substrates;

a processing chamber in which the substrate or the substrates are processed;

a first stage which is to hold first and second boats one at a time which are respectively to hold the substrate or the substrates and which first stage is to move the first and second boats one at a time into and out from the processing chamber;

a second stage which is to hold the first and second boats one at a time;

a third stage which is to hold the first and second boats one at a time;

a boat transfer mechanism which transfers the first and second boats between the first, second and third stages;

a substrate transfer mechanism which transfers the substrate or substrates from the carrier placed at the carrier-holding stage to either one of the first and second boats which is held by the first stage; and a controller which controls the first stage, the boat transfer mechanism and the substrate transfer mechanism such that the boat transfer mechanism transfers one of the first and second boats from the second stage to the first stage, the wafer transfer mechanism thereafter transfers the substrate or the substrates from the carrier held at the carrier-holding stage to the one of the first and second boats held by the first stage, and the first stage thereafter moves the one of the first and second boats into the processing chamber to process the substrate or the substrates in the processing chamber.

According to a second aspect of the present invention, there is provided a producing method of a semiconductor device, comprising:

processing a first substrate or first substrates held by a first boat in a processing chamber;

moving, after processing the first substrate or the first substrates, the first boat holding the first substrate or the substrates out from the processing chamber by the first stage;

transferring the first boat holding the first substrate or the substrates from the first stage to a second stage;

transferring a second boat to the first stage;

charging a second substrate or second substrates to the second boat at the first stage;

moving the second boat charged with the second substrate or the second substrates into the processing chamber by the first stage; and processing the second substrate or the second substrates held by the second boat in the processing chamber.

BRIEF DESCRIPTION OF THE DRAWINGS

The above and further objects, features and advantages of the present invention will become more apparent from the following detailed description taken in conjunction with the accompanying drawings, wherein:

FIG. 3 is a vertical sectional view taken along a line II—II of FIG. 1 and showing a state in which wafers on a first boat are being processed;

FIG. 5 is a perspective view, partially omitted, for explaining a CVD apparatus according to a first embodiment of the present invention and showing a state in which a first boat is taken out from a processing chamber;

DESCRIPTION OF THE PREFERRED EMBODIMENTS (First Embodiment)

Figure 1:
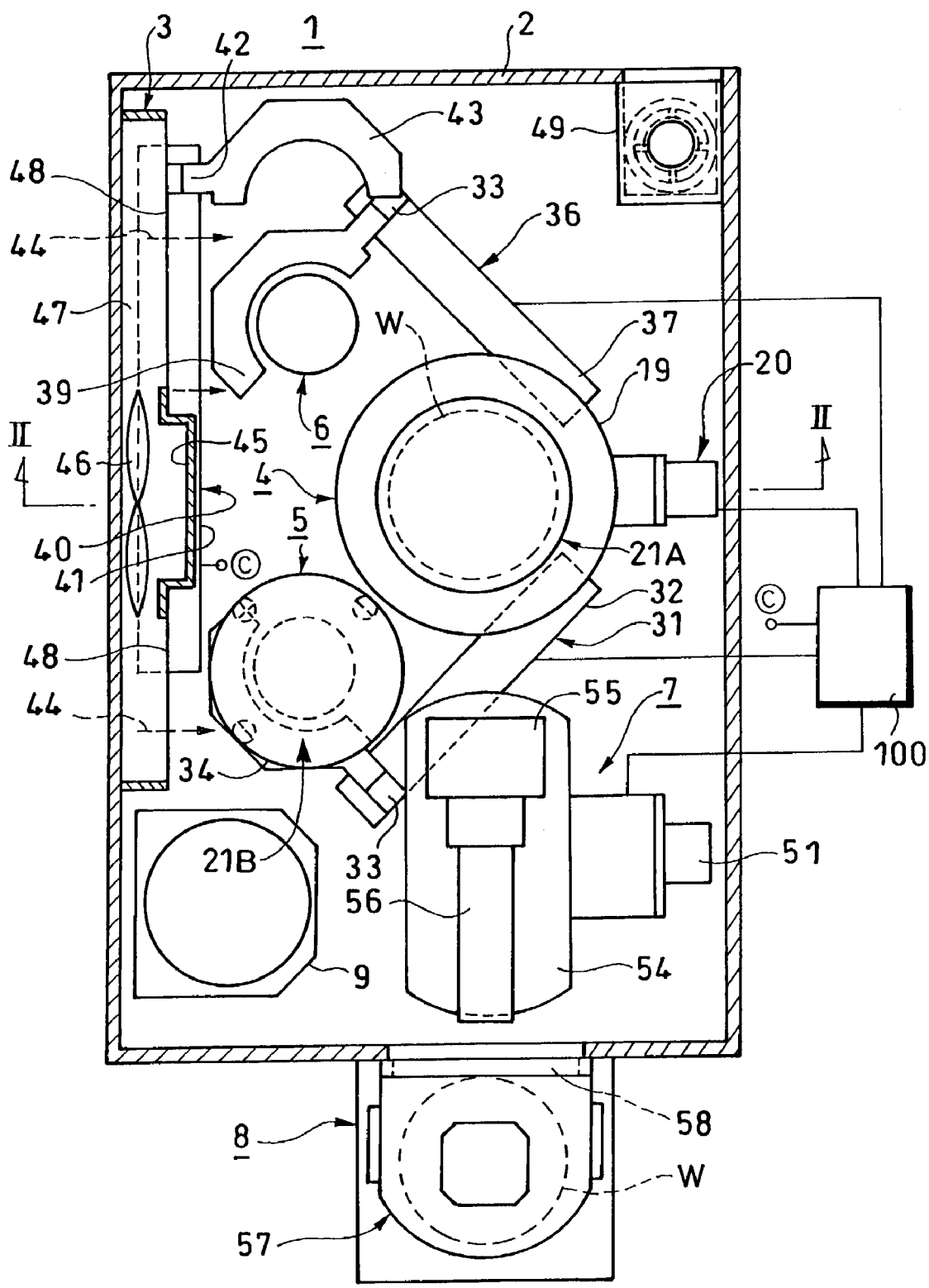
FIG. 1 is a transversal sectional view for explaining a CVD apparatus according to a first embodiment of the present invention.

In this embodiment, a semiconductor device producing apparatus according to the present invention is constituted as a batch-type vertical hot wall CVD (Chemical Vapor Deposition) apparatus (CVD apparatus, hereinafter) as shown in FIG. 1, and is used for subjecting a wafer as a substrate to CVD processing such as annealing processing, oxide film-forming processing, dispersing processing and film-forming processing. In the following explanation, front, rear, left and right are based on FIG. 1. That is, a pod stage 8 side is a front side, a side (cooling stage 6 side) opposed to the pod stage 8 side is a rear side, a clean unit 3 side is a left side, and a side (boat elevator 20 side) opposed to the clean unit 3 side is a right side.

As shown in FIG. 1, a CVD apparatus 1 according to this embodiment has a case 2 which is formed into a rectangular parallelepiped box having a rectangular shape as viewed from above. A clean unit 3 is disposed on a left sidewall of the case 2. The clean unit 3 supplies, into the case 2, clean air whose temperature and moisture are sufficiently controlled. A thermal processing stage 4 is set at substantially a central portion in the case 2. A cooling stage 6 for temporarily placing a processed boat and cooling the same is set at a rear side of a left side of the thermal processing stage 4. A standby stage 5 is set at a front side of the left side of the thermal processing stage 4. The standby stage 5 transfers a wafer on a boat which is cooled by a cooling stage 6 to a pod 57, and temporarily places a vacant boat which was transferred out and allows the boat to be on standby. A wafer transfer apparatus 7 is disposed on a front side in the case 2, and a pod stage 8 is set in front of the wafer transfer apparatus 7. A notch-aligning apparatus 9 is disposed on the left side of the wafer transfer apparatus 7.

Figure 2:
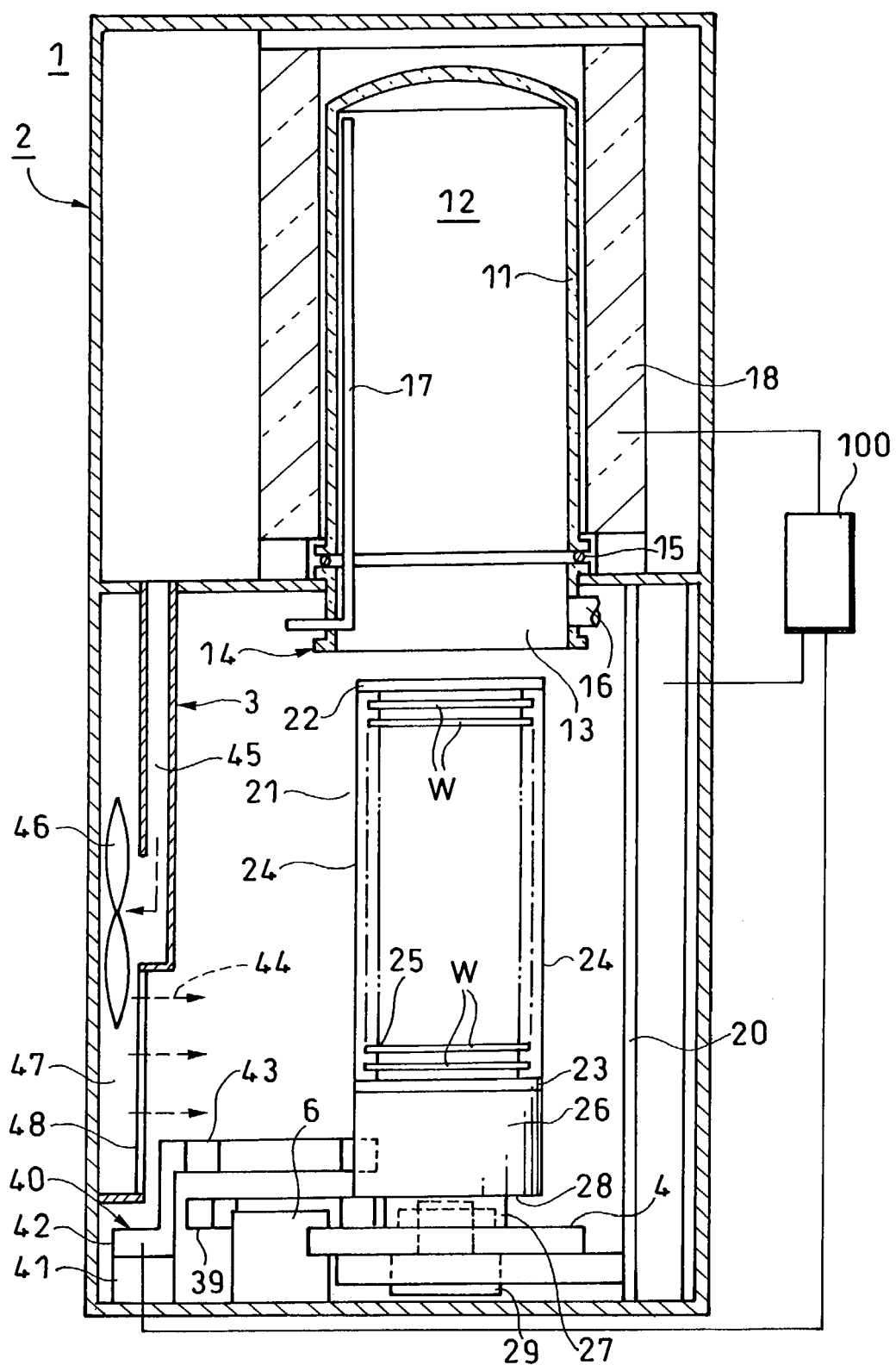
FIG. 2 is a vertical sectional view taken along a line II—II of FIG. 1.

As shown in FIGS. 2 and 3, a process tube 11 is vertically disposed on an upper portion of the thermal processing stage 4 such that a center line of the process tube 11 is directed vertically. The process tube 11 is made of quartz glass, and is integrally formed into a cylindrical shape whose lower end is opened. A cylindrical hollow portion of the process tube 11 is formed as a processing chamber 12 into which a plurality of wafers concentrically held by a boat are transferred. The opened lower end of the process tube 11 abuts against an upper end of a manifold 14 through a seal ring 15 therebetween. The manifold 14 is supported by the case 2 so that the process tube 11 is supported vertically. An opened lower end of the manifold 14 constitutes a furnace opening 13 through which a wafer is loaded to and unloaded from the processing chamber 12. An exhaust pipe 16 is connected to a portion of a sidewall of the manifold 14 such that the exhaust pipe 16 comes into communication with the processing chamber 12. The other end of the exhaust pipe 16 is connected to an exhaust apparatus (not shown) which evacuates the processing chamber 12 to a predetermined degree of vacuum. A gas introducing pipe 17 is connected to the other portion of the sidewall of the manifold 14 such that the gas introducing pipe 17 comes into communication with the processing chamber 12. The other end of the gas introducing pipe 17 is connected to a gas supply apparatus (not shown) for supplying gas such as raw material gas, nitrogen gas and the like. A heater unit 18 is disposed outside the process tube 11 such as to concentrically surround the process tube 11. The heater unit 18 is supported by the case 2 and mounted vertically. The heater unit 18 uniformly heats an interior of the processing chamber 12 entirely.

A thermal processing stage 4 is concentrically disposed directly below the furnace opening 13. The thermal processing stage 4 is formed into a disk-like shape having substantially the same outer diameter as that of the manifold 14. The thermal processing stage 4 supports a boat 21 such that the boat 21 vertically stands on a center line of the thermal processing stage 4. The thermal processing stage 4 is vertically moved up and down by a boat elevator 20 comprising a feed screw mechanism, thereby closing the manifold 14. In this embodiment, two boats 21 are used, and one of the two boats 21 is inserted into the processing chamber 12. As shown in FIGS. 2 and 3, each of the two boats 21 and 21 includes a pair of upper and lower end plates 22 and 23, and a plurality of (three in this embodiment) holding members 24 which are vertically provided between both the end plates 22 and 23. A plurality of holding grooves 25 are inscribed in each holding member 24 at equal distances from one another in its longitudinal direction such that the holding grooves 25 are opened on the same plane. Edges of wafers Ware inserted between the holding grooves 25 on the same plane so that the wafers W are arranged horizontally with respect to the boat 21 and centers of the wafers W are aligned to each other. A thermal insulation cap 26 is formed under the lower end plate 23 of the boat 21, and a column 27 vertically downwardly projects from a lower surface of the thermal insulation cap 26. The column 27 is formed into a cylindrical shape having a diameter smaller than an outer diameter of the thermal insulation cap 26. A space is formed in a lower surface of the column 27 under the lower surface of the thermal insulation cap 26. An arm of a boat transfer apparatus (which will be described later) is inserted into the space, and an engaging portion 28 for engaging the arm with an outer peripheral portion of the lower surface of the column 27 is formed. The boat 21 is rotated by a rotary actuator 29 disposed in the thermal processing stage 4.

Figure 4:
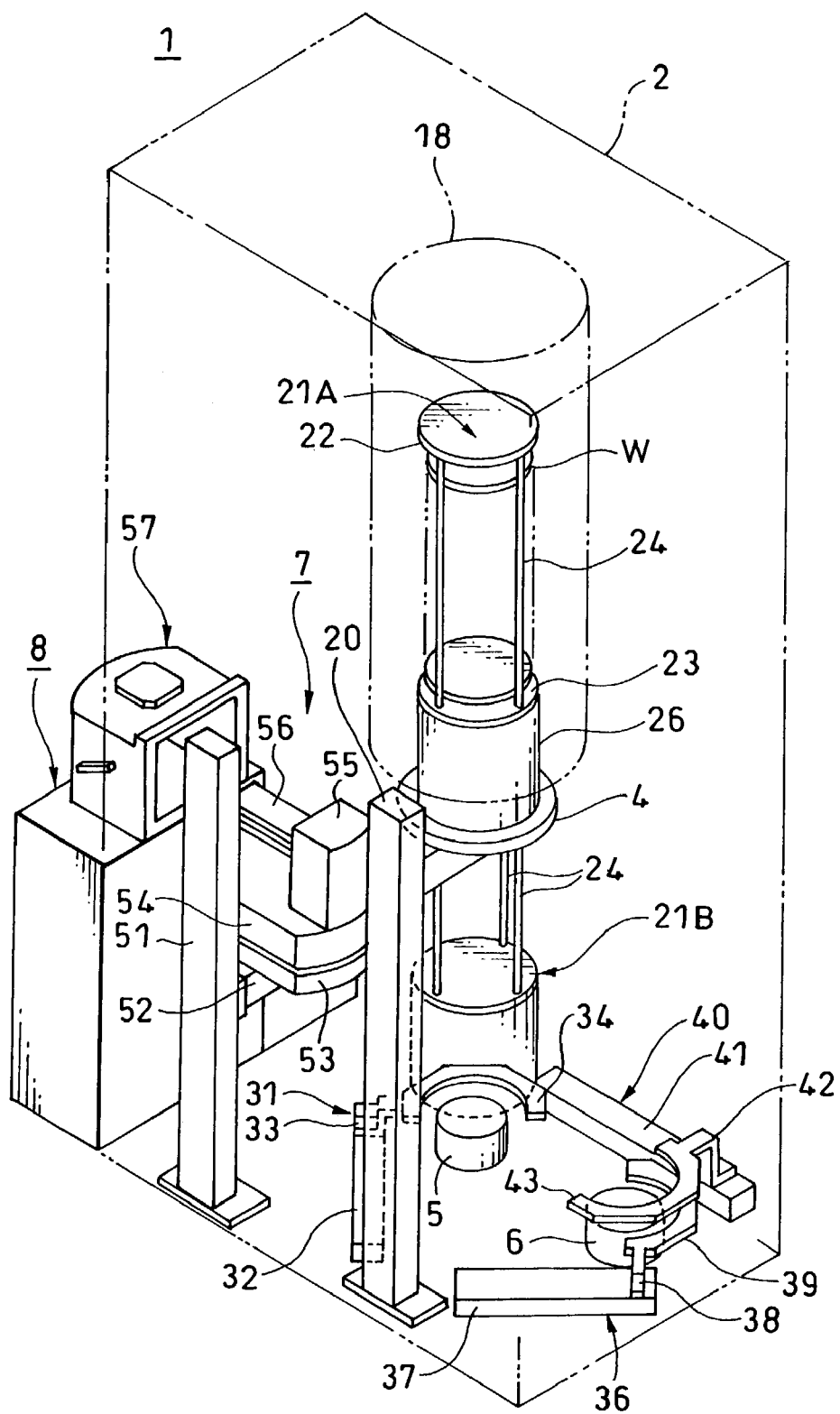
FIG. 4 is a perspective view, partially omitted, for explaining a CVD apparatus according to a first embodiment of the present invention and showing a state in which wafers on a first boat are being processed.

The standby stage 5 shown in FIGS. 1, 4 and the like vertically supports the boat 21, and is moved up and down by an elevator (not shown) comprising a screw type jack or the like. A boat transfer apparatus (first boat transfer apparatus, hereinafter) 31 for transferring the boat 21 from the standby stage 5 to the thermal processing stage 4 is provided between the standby stage 5 and the thermal processing stage 4. The first boat transfer apparatus 31 includes a linear actuator 32 disposed in parallel to a line segment connecting a center of the standby stage 5 and a center of the thermal processing stage 4, and reciprocates a moving stage 33 in a horizontal plane. An arm 34 formed into a substantially semi-circular arc shape projects from the moving stage 33. The arm 34 engages with an engaging portion 28 of an insulation cap 26 from below in a state in which the arm 34 is inserted to an outer side of the column 27 of the boat 21 so that the arm 34 vertically supports the entire boat 21.

The cooling stage 6 also vertically supports the boat 21, and is moved up and down by an elevator (not shown) comprising a screw type jack or the like. A boat transfer apparatus (second boat transfer apparatus, hereinafter) 36 for transferring the boat 21 from the thermal processing stage 4 to the cooling stage 6 is provided between the cooling stage 6 and the thermal processing stage 4. The second boat transfer apparatus 36 includes a linear actuator 37 disposed in parallel to a line segment connecting a center of the cooling stage 6 and a center of the thermal processing stage 4, and reciprocates a moving stage 38 in a horizontal plane. An arm 39 formed into a substantially semi-circular arc shape projects from the moving stage 38. The arm 39 engages with the engaging portion 28 of an insulation cap 26 from below in a state in which the arm 39 is inserted to an outer side of the column 27 of the boat 21 so that the arm 39 vertically supports the entire boat 21.

A boat transfer apparatus (third boat transfer apparatus, hereinafter) 40 for transferring the boat 21 from the cooling stage 6 to the standby stage 5 is provided between the cooling stage 6 and the standby stage 5. The third boat transfer apparatus 40 includes a linear actuator 41 disposed in parallel to a line segment connecting a center of the cooling stage 6 and a center of the standby stage 5, and reciprocates a moving stage 42 in a horizontal plane. An arm 43 formed into a substantially semi-circular arc shape projects from the moving stage 42. The arm 43 engages with the engaging portion 28 of an insulation cap 26 from below in a state in which the arm 43 is inserted to an outer side of the column 27 of the boat 21 so that the arm 43 vertically supports the entire boat 21.

As shown in FIG. 1, a clean unit 3 for supplying clean air into the case 2 blows clean air toward the standby stage 5 and the cooling stage 6. That is, the clean unit 3 includes a suction duct 45 which sucks air outside the CVD apparatus 1, or clean air 44 which is once blown into the CVD apparatus 1. A suction fan 46 is disposed at a lower end of the suction duct 45. A blowout duct 47 is disposed on the side of a discharge port of the suction fan 46. The blowout duct 47 extends long in the longitudinal direction. Large blowout ports 48 are formed at front and rear opposite sides of the suction duct 45 in an inner side surface of the case 2 of the blowout duct 47. The clean air 44 is allowed to blow toward the standby stage 5 and the cooling stage 6 through the blowout ports 48. Each of the blowout ports 48 is provided with a dust collecting filter or a chemical filter (not shown) so that air is cleaned and allowed to blow. An exhaust fan 49 is disposed at a right corner in a rear side in the case 2. The exhaust fan 49 sucks clean air 44 sent from the blowout duct 47 of the clean unit 3, and discharges the air outside the case 2.

The wafer transfer apparatus 7 shown in FIGS. 1 and 4 to 7 transfers the wafer W between the pod on the pod stage 8 and the boat 21 on the standby stage 5. That is, the wafer transfer apparatus 7 includes elevator 51, and the elevator 51 moves an arm 52 up and down. A tip end of the arm 52 is provided with a base 53 having a rotary actuator, and a transfer body 54 can rotate horizontally. The transfer body 54 on the base 53 is provided with a linear actuator, and the linear actuator can move a moving stage 55 placed thereon forward and backward horizontally. The moving stage 55 is provided with a plurality of tweezers 56 for supporting the wafer W from below. The tweezers 56 are horizontally mounted and arranged vertically at equal distances from one another.

An FOUP (front Opening Unified pod, simply called a pod, hereinafter) is placed on the pod stage 8 one each as a carrier (accommodating container) for transferring the wafer W. The pod 57 is formed into a substantially parallelepiped box-like shape whose one surface is opened. A door 58 is detachably mounted to such an opening. When a pod as a carrier for a wafer is used, since the wafer is transferred in a tightly-closed state, even if particles or the like exist in the surrounding atmosphere, cleanliness of the wafer can be maintained. Therefore, it is unnecessary to so much highly set the cleanliness in a clean room where the CVD apparatus is placed and thus, it is possible to reduce costs required for the clean room. The pod 57 is used as a carrier for a wafer in the CVD apparatus of this embodiment. The pod stage 8 is provided with a door opening/closing apparatus (not shown) for opening and closing the door 58 of the pod 57.

The wafer transfer apparatus 7, the heater unit 18, the boat elevator 20 and the boat transfer apparatuses 31, 36 and 40 are connected to a control apparatus 100 and controlled by the control apparatus 100.

A producing method of a semiconductor device according to a first embodiment of the present invention will be explained below mainly based on an operating method of the pair of boat.

As shown in FIG. 1, one of the pair of boats 21 and 21 (first boat 21A, hereinafter) is placed on the thermal processing stage 4, and the other boat (second boat 21B, hereinafter) is placed on the standby stage 5. The pod 57 in which a plurality of wafers W are accommodated is supplied to the pod stage 8. The door 58 of the pod 57 supplied to the pod stage 8 is opened by the door opening/closing apparatus.

If the door 58 of the pod 57 is opened, the wafers W of the pod 57 on the pod stage 8 are transferred and charged to the first boat 21A by the wafer transfer apparatus 7. That is, the moving stage 55 of the wafer transfer apparatus 7 moves toward the pod 57, and the tweezers 56 are inserted into the pod 57 to receive the wafers W in the pod 57. Then, the tweezers 56 retreat and the transfer body 54 is turned and then, the moving stage 55 moves toward the standby stage 5, and the tweezers 56 deliver the wafers W held by the tweezers 56 to the holding grooves 25 of the first boat 21A. After the moving stage 55 which delivered the wafers W retreats, the transfer body 54 is again turned to direct the tweezers 56 to the pod 57. Thereafter, the above-described operation is repeated. Since the wafer transfer apparatus 7 includes the plurality of tweezers 56, it is possible to transfer the plurality of wafers W from the plurality of holding grooves of the pod 57 to the plurality of holding grooves 25 of the first boat 21A at a time. Since the number of wafers W handled by the first boat 21A at a time is greater than the number of wafers W accommodated in one pod 57, the wafer transfer apparatus 7 moves and transfers a predetermined number of wafers up and down from a plurality of pods 57 to the first boat 21A by the elevator 51.

The first boat 21A on which a designated number of wafers W are placed by the thermal processing stage 4 is moved up by the boat elevator 20, and the first boat 21A is transferred to the processing chamber 12 of the process tube 11 as shown in FIGS. 3 and 4. If the first boat 21A reaches its upper limit, an outer peripheral portion of an upper surface of the thermal processing stage 4 seats on a lower surface of the manifold 14 to seal and close the lower end opening of the manifold 14. Therefore, the processing chamber 12 is air-tightly closed.

If the processing chamber 12 is air-tightly closed by the thermal processing stage 4, a pressure in the processing chamber 12 is adjusted to a predetermined value by evacuation of the exhaust pipe 16, and the interior of the processing chamber 12 is entirely heated uniformly or with a predetermined temperature distribution to a predetermined processing temperature (e.g., 800 to 1,000° C.). If a temperature of the processing chamber 12 is stabilized, processing gas is supplied into the processing chamber 12 through the gas introducing pipe 17 in a predetermined flow. With this operation, predetermined processing is carried out. If the predetermined processing is processing for forming a silicon nitride ($Si_3N_4$) film for example, mono-silane ($SiH_4$) and ammonia ($NH_3$) are supplied in a predetermined flow at a temperature of about 800° C. or lower. If the predetermined processing is processing for oxidizing a silicon wafer by dry oxidation, oxygen ($O_2$) and hydrogen chloride (HCl) are supplied in a predetermined flow at a temperature of about 900° C. or lower. Although the processing chamber 12, the process tube 11 and the gas introducing pipe 17 are schematically illustrated in FIGS. 2 and 3, these elements can be deformed into various know forms depending upon desired processing of course, and processing conditions such as a temperature, a pressure and kinds of processing gas can appropriately be changed depending upon desired processing. If the predetermined film-forming processing is completed, nitrogen gas is supplied through the gas introducing pipe 17 in a predetermined flow and for predetermined duration, gas in the processing chamber 12 is replaced by the nitrogen gas, and the temperature is reduced.

Next, in FIG. 5, the thermal processing stage 4 supporting the first boat 21A is moved down by the boat elevator 20, and the first boat 21A is transferred out from the processing chamber 12 of the process tube 11. After the first boat 21A is transferred out, the furnace opening 13 is closed by a shutter (not shown), thereby preventing high temperature atmosphere in the processing chamber 12 from escaping. The first boat 21A (including the held group of wafers W) transferred out from the processing chamber 12 is in a high temperature state.

Figure 6:
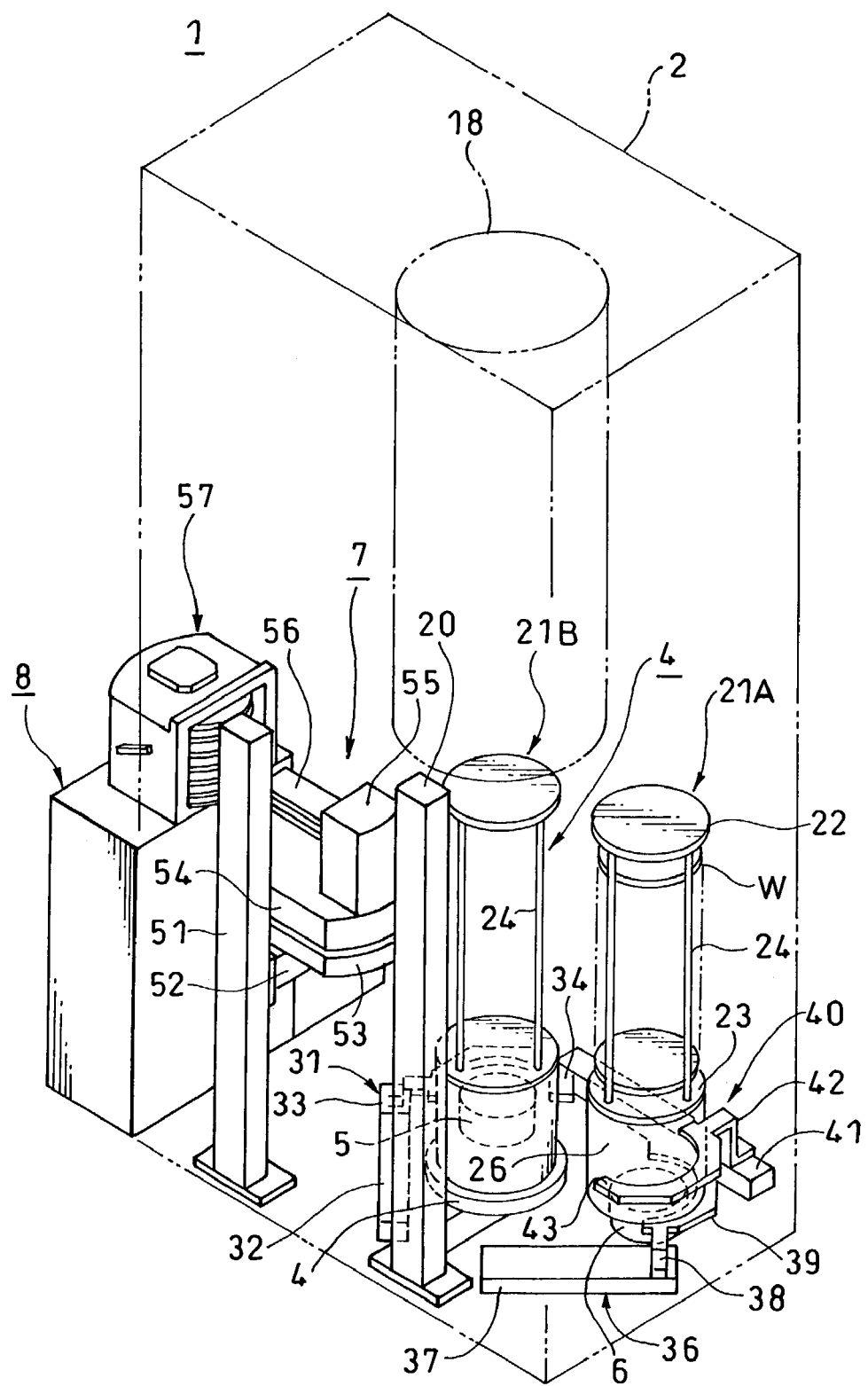
FIG. 6 is a perspective view, partially omitted, for explaining a CVD apparatus according to a first embodiment of the present invention and showing a state after first and second boats have been transferred.

Then, in FIG. 6, the high temperature processed first boat 21A transferred out from the processing chamber 12 is immediately transferred to and placed on the cooling stage 6 from the thermal processing stage 4 on an axis of the process tube 11 by the arm 39 of the second boat transfer apparatus 36. At that time, the first boat 21A is appropriately moved up and down by the boat elevator 20 of the thermal processing stage 4 and the elevator of the cooling stage 6 and appropriately received. Since the cooling stage 6 is set in the vicinity of the blowout port 48 of the clean unit 3, the high temperature first boat 21A transferred to the cooling stage 6 is effectively cooled by clean air 44 sent from the blowout port 48 of the clean unit 3.

As shown in FIG. 6, if the first boat 21A is transferred from the thermal processing stage 4 to the cooling stage 6, the second boat 21B on the standby stage 5 is transferred onto the thermal processing stage 4 by the first boat transfer apparatus 31. That is, the arm 34 of the first boat transfer apparatus 31 is inserted into an outer side of the column 27 of the second boat 21B and is engaged with the engaging portion 28 of the thermal insulation cap 26 from below, thereby supporting the second boat 21B vertically. In this state, the arm 34 moved horizontally toward the thermal processing stage 4, thereby delivering the second boat 21B from the standby stage 5 onto the thermal processing stage 4. At that time, the second boat 21B is appropriately moved up and down by the elevator of the standby stage 5 and the boat elevator 20 of the thermal processing stage 4 and appropriately received. The arm 34 of the first boat transfer apparatus 31 which transfers the second boat 21B to the thermal processing stage 4 is returned toward the standby stage 5.

If the second boat 21B is placed on the thermal processing stage 4, the door 58 of the pod 57 supplied to the pod stage 8 is opened by the door opening/closing apparatus. If the door 58 of the pod 57 is opened, the wafers W of the pod 57 of the pod stage 8 are transferred and charged to the second boat 21B by the wafer transfer apparatus 7 in the same manner as that of the first boat 21A. At that time, the second boat 21B is rotated by the rotary actuator 29 of the thermal processing stage 4, thereby changing the moving direction of the second boat 21B to a retreating direction of the tweezers 56 of the wafer transfer apparatus 7.

Figure 7:
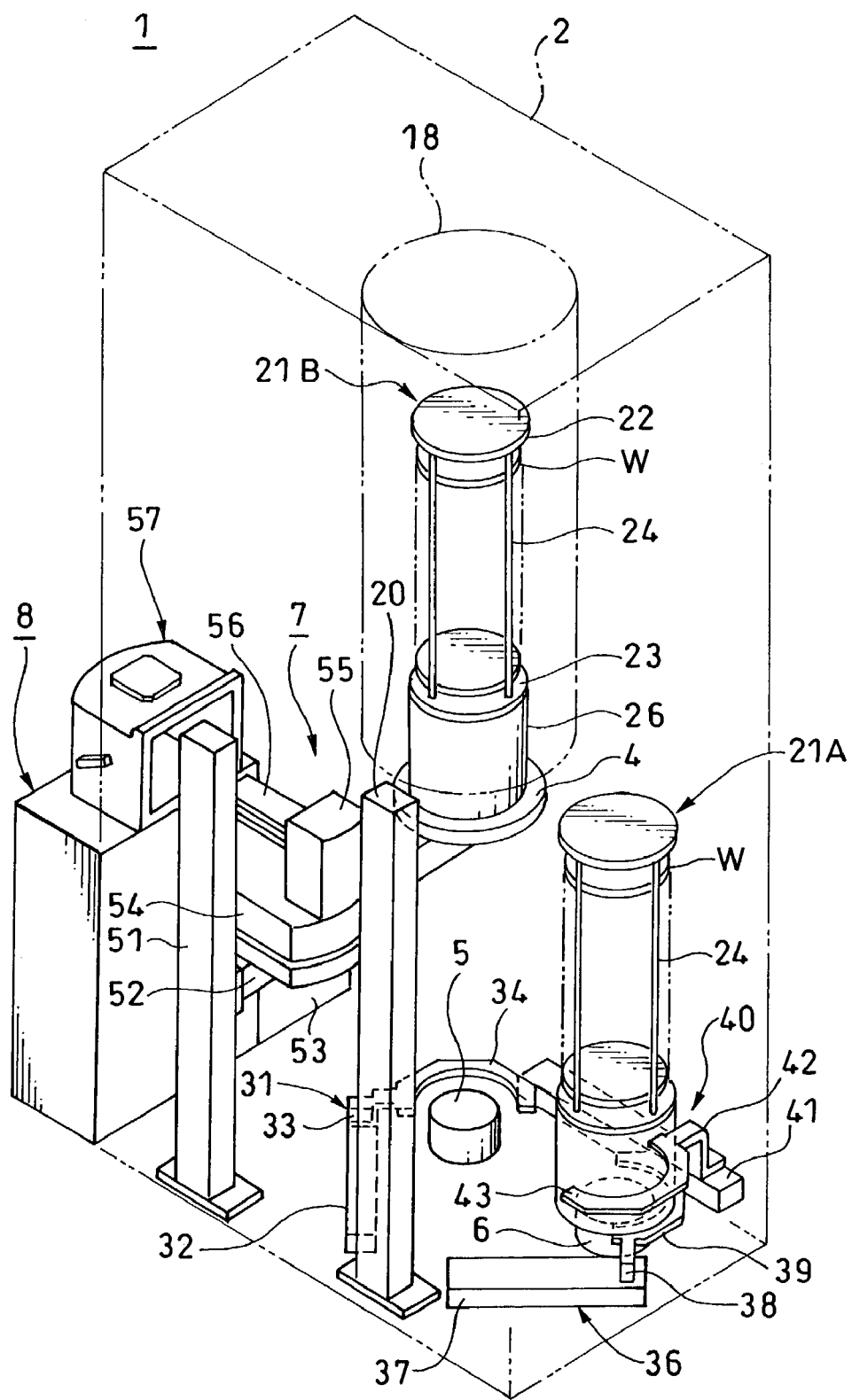
FIG. 7 is a perspective view, partially omitted, for explaining a CVD apparatus according to a first embodiment of the present invention and showing a state in which wafers on a second boat are being processed.

If the thermal processing stage 4 is moved up by the boat elevator 20, the second boat 21B on which a designated number of wafers W are placed by the thermal processing stage 4 is transferred to the processing chamber 12 as shown in FIG. 7. The group of wafers W of the second boat 21B transferred to the processing chamber 12 is subjected to the same processing as that of the group of wafers W of the first boat 21A.

While the group of wafers W of the second boat 21B is processed, as shown in FIG. 4, the first boat 21A of the cooling stage 6 is transferred onto the standby stage 5 by the third boat transfer apparatus 40. That is, the arm 43 of the third boat transfer apparatus 40 is engaged with an outer side of the column 27 of the first boat 21A, and engaged with the engaging portion 28 of the thermal insulation cap 26 from below, thereby vertically supporting the first boat 21A. In this state, the arm 43 horizontally moves toward the standby stage 5, thereby delivering the first boat 21A from the cooling stage 6 to the standby stage 5. At that time, the first boat 21A is appropriately delivered by appropriately vertically moving the elevator of the cooling stage 6 and the elevator of the standby stage 5. The arm 43 of the third boat transfer apparatus 40 which transferred the first boat 21A to the standby stage 5 is returned to the cooling stage 6. The processed first boat 21A is sufficiently cooled to 157° C. or lower for example.

If the first boat 21A is placed on the standby stage 5, a vacant pod 57 is supplied to the pod stage 8 as shown in FIG. 4, and the door 58 is opened by the door opening/closing apparatus. If the door 58 of the pod 57 is opened, the processed wafers W of the first boat 21A are discharged to a vacant pod 57 from the first boat 21A by the transferring operation of the wafer transfer apparatus 7 in accordance with the above-described operation. At that time, the advancing and retreating direction of the first boat 21A with respect to the tweezers 56 of the wafer transfer apparatus 7 is previously adjusted by rotating the first boat 21A by the rotary actuator 29 of the thermal processing stage 4 when the first boat 21A is transferred to the cooling stage 6 from the thermal processing stage 4.

Thereafter, the above-described effect is alternately repeated between the first boat 21A and the second boat 21B, and a large number of wafers W are batch processed by the CVD apparatus 1.

According to the above embodiment, the following effects can be obtained.

1) A vacant boat of the standby stage is transferred onto the thermal processing stage, and wafers are mounted on the thermal processing stage. With this, standby time in atmosphere required until the wafers are transferred into the processing chamber can be shortened and thus, it is possible to prevent natural oxide film from being generated on the wafer.

2) By charging the wafers to the first boat and the second boat in the thermal processing stage, it is possible to shorten the waiting time from the charging operation. Therefore, it is possible to suppress damage caused at the time of earthquake.

3) The vacant first boat and second boat are transferred from the standby stage to the thermal processing stage, and the charging operation of the wafers can be carried out in the thermal processing stage. With this, it is possible to prevent the positional displacement of the wafer which may be caused by vibration when the wafers are transferred by the first boat and the second boat. Therefore, it is possible to restrain particles from being generated, and uniformity of the thermal processing distribution such as film thickness distribution can be enhanced as compared with a case in which the first boat and the second boat on which the wafers are charged in the standby stage are transferred from the standby stage to the thermal processing stage.

(Second Embodiment)

Next, a second embodiment of the present invention will be explained. The same constituent elements and constituent elements having the same function as in the first embodiment are designated with the same symbols as in the first embodiment.

Figure 8:
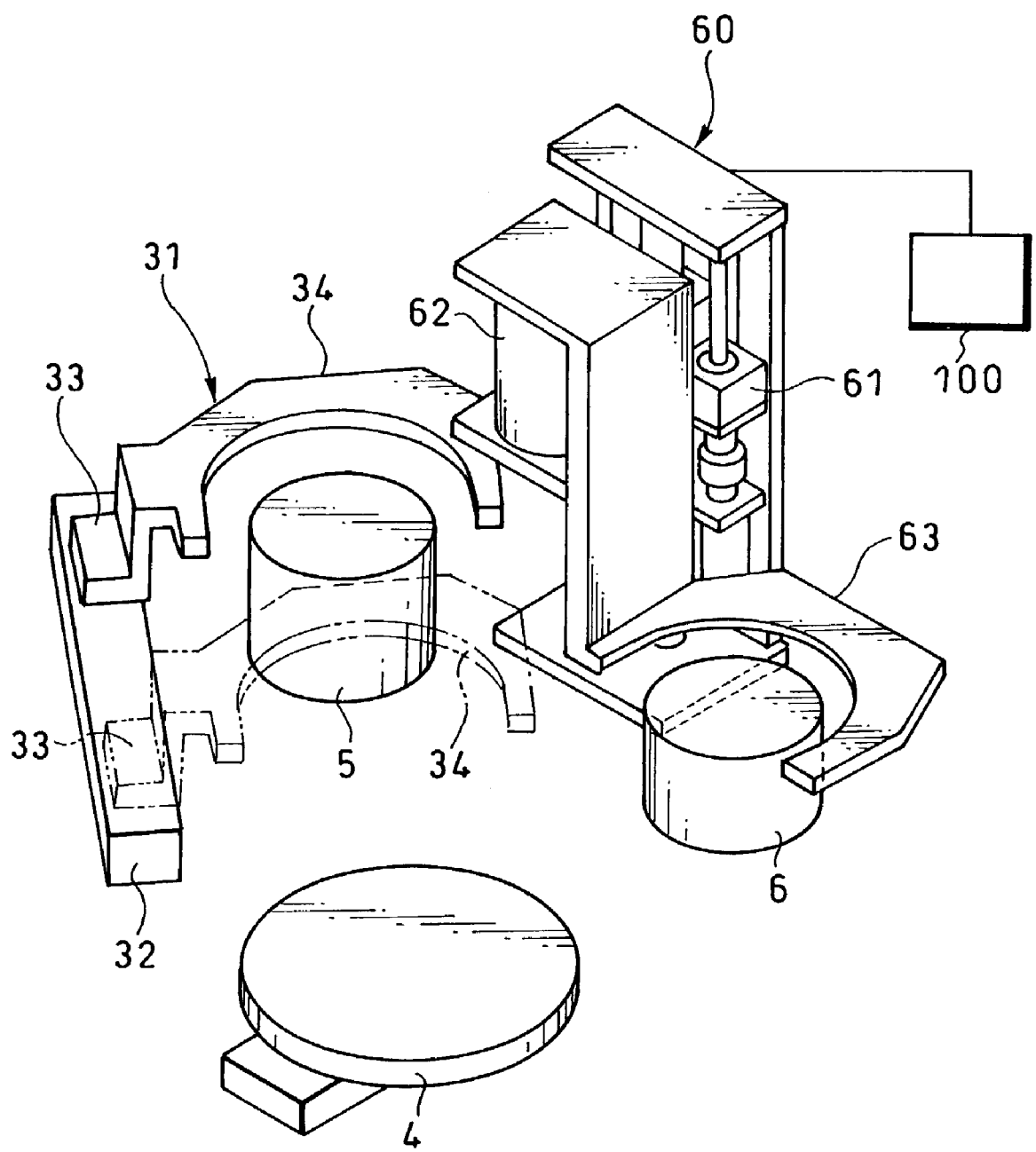
FIG. 8 is a perspective view, partially omitted, for explaining a boat transfer apparatus according to a second embodiment of the present invention.

A CVD apparatus of the second embodiment is different from that of the first embodiment in that a boat transfer apparatus 60 is provided for transferring the first boat 21A and the second boat 21B between the thermal processing stage 4 and the cooling stage 6 and between the cooling stage 6 and the standby stage 5, instead of the second boat transfer apparatus 36 and the third boat transfer apparatus 40 as shown in FIG. 8. As shown in FIG. 8, the boat transfer apparatus 60 comprises a linear actuator 61 directed in the vertical direction, a rotary actuator 62 which is moved up and down by the linear actuator 61, and an arm 63 which reciprocates in a horizontal plane by the rotary actuator 62 such as to draw an arc of about 180°. The arm 63 is formed into substantially a semi-circular arc shape, and in a state in which the arm 63 is inserted to an outer side of the columns 27 of the first boat 21A and second boat 21B, the arm 63 is engaged with the engaging portion 28 of the thermal insulation cap 26 from below, thereby vertically supporting the first boat 21A and second boat 21B.

A CVD processing step of a producing method of a semiconductor device according to the second embodiment of the present invention will be explained mainly based on an operation method of the pair of boats.

Similarly to FIG. 1 (first embodiment), the first boat 21A is placed on the thermal processing stage 4, and the second boat 21B is placed on the standby stage 5. The pod 57 in which the plurality of wafers W are accommodated is supplied to the pod stage 8. The door 58 of the pod 57 supplied to the pod stage 8 is opened by the door opening/closing apparatus.

If the door 58 of the pod 57 is opened, the wafers W of the pod 57 of the pod stage 8 are transferred and charged to the first boat 21A by the wafer transfer apparatus 7.

Similarly to FIG. 4 (first embodiment), the first boat 21A on which a designated number of wafers W are placed by the thermal processing stage 4 is transferred into the processing chamber 12 by moving the thermal processing stage 4 upward by the boat elevator 20. If the first boat 21A reaches its upper limit, the outer peripheral portion of the upper surface of the thermal processing stage 4 seats on the lower surface of the manifold 14 so that the lower end opening of the manifold 14 is sealed and closed. Therefore, the processing chamber 12 is air-tightly closed. If the processing chamber 12 is air-tightly closed by the thermal processing stage 4, the thermal processing is carried out in the same manner as that of the previous embodiment.

Next, in the same manner as that shown in FIG. 5 (first embodiment), the thermal processing stage 4 supporting the first boat 21A is lowered by the boat elevator 20, and the first boat 21A is transferred out from the processing chamber 12. The furnace opening 13 after the first boat 21A is transferred out is closed by the shutter, thereby preventing the high temperature atmosphere in the processing chamber 12 from escaping. The first boat 21A (including the held group of wafers W) transferred out from the processing chamber 12 is in a high temperature state.

Then, the high temperature processed first boat 21A transferred out from the processing chamber 12 is immediately transferred to and placed on the cooling stage 6 from the thermal processing stage 4 on an axis of the process tube 11 by the arm 63 of the boat transfer apparatus 60. That is, the arm 63 of the boat transfer apparatus 60 is inserted to an outer side of the column 27 of the first boat 21A and engaged with the engaging portion 28 of the thermal insulation cap 26 from below, thereby vertically supporting the first boat 21A. In this state, the arm 63 moves from a direction of the thermal processing stage 4 toward the cooling stage 6 such as to draw an arc of 90°, and the first boat 21A is transferred and delivered to the cooling stage 6 from the thermal processing stage 4. Since the cooling stage 6 is set in the vicinity of the blowout port 48 of the clean unit 3, the high temperature first boat 21A moved to the cooling stage 6 is effectively cooled by clean air 44 sent from the blowout port 48 of the clean unit 3.

If the first boat 21A is transferred from the thermal processing stage 4 to the cooling stage 6, similarly to FIG. 6 (first embodiment), the second boat 21B on the standby stage 5 is transferred onto the thermal processing stage 4 by the first boat transfer apparatus 31. That is, the arm 34 of the first boat transfer apparatus 31 is inserted to an outer side of the column 27 of the second boat 21B and engaged with the engaging portion 28 of the thermal insulation cap 26 from below, thereby vertically supporting the second boat 21B. In this state, the arm 34 is slid in a direction of the thermal processing stage 4, and the second boat 21B is delivered onto the thermal processing stage 4 from the standby stage 5. The arm 34 of the first boat transfer apparatus 31 which transferred the second boat 21B to the thermal processing stage 4 is returned toward the standby stage 5.

If the second boat 21B is placed on the thermal processing stage 4, the door 58 of the pod 57 supplied to the pod stage 8 is opened by the door opening/closing apparatus. If the door 58 of the pod 57 is opened, like the first boat 21A, the wafers W of the pod 57 of the pod stage 8 are transferred and charged to the second boat 21B by the wafer transfer apparatus 7. At that time, the second boat 21B is rotated by the rotary actuator 29 of the thermal processing stage 4, a direction of he second boat 21B is changed to the advancing and retreating direction of the tweezers 56 of the wafer transfer apparatus 7.

The second boat 21B on which a designated number of wafers W are placed by the thermal processing stage 4 is transferred into the processing chamber 12 of the process tube 11 in the same manner as that shown in FIG. 7 (first embodiment) by moving the thermal processing stage 4 upward by the boat elevator 20. The group of wafers W of the second boat 21B transferred into the processing chamber 12 is subjected to the same processing as that of the group of Wafers W of the first boat 21A.

While the wafers W of the second boat 21B are processed, the first boat 21A of the cooling stage 6 is transferred onto the standby stage 5 by the boat transfer apparatus 60 in the same manner as that that shown in FIG. 4 (first embodiment). That is, the arm 63 of the boat transfer apparatus 60 is inserted to an outside of the column 27 of the first boat 21A and engaged with the engaging portion 28 of the thermal insulation cap 26 from below, thereby vertically supporting the first boat 21A. In this state, the first boat 21A is delivered onto the standby stage 5 from the cooling stage 6 by moving the first boat 21A such as to draw an arc of 180° toward the standby stage 5. The arm 63 of the boat transfer apparatus 60 which transferred the first boat 21A to the standby stage 5 is returned toward the cooling stage 6. At that time, the processed first boat 21A is sufficiently cooled to 157° C. or lower for example.

If the first boat 21A is placed on the standby stage 5, a vacant pod 57 is supplied to the pod stage 8 in the same manner as that shown in FIG. 4 (first embodiment), the door 58 is opened by the door opening/closing apparatus. If the door 58 of the pod 57 is opened, the processed wafers W of the first boat 21A are discharged to a vacant pod 57 from the first boat 21A by the transferring operation of the wafer transfer apparatus 7 in accordance with the above-described operation. At that time, the advancing and retreating direction of the first boat 21A with respect to the tweezers 56 of the wafer transfer apparatus 7 is previously adjusted by rotating the first boat 21A by the rotary actuator 29 of the thermal processing stage 4 when the first boat 21A is transferred to the cooling stage 6 from the thermal processing stage 4.

Thereafter, the above-described effect is alternately repeated between the first boat 21A and the second boat 21B, and a large number of wafers W are batch processed by the CVD apparatus 1.

According to the above-mentioned second embodiment, the same effects as the first embodiment can be obtained.

The present invention is not limited to the above embodiments and can be variously modified within the gist of the present invention of course.

The case is not limited to a structure in which clean air whose temperature and moisture are controlled flows to the case, and a structure in which inert gas such as nitrogen gas flows to the case may be employed. If the case is formed into such a structure in which the inert gas flows to the case, generation of natural oxide film by oxygen ($O_2$) can also be prevented.

Further, the case can be formed into a load lock system (the processing chamber and a loading/unloading chamber are isolated using an isolating valve such as a gate valve to prevent air from flowing into the processing chamber, or disturbance such as temperature or pressure is reduced to stabilize the processing). If the case is formed into the load lock system, it is possible to more reliably prevent the natural oxide film from being generated.

The CVD apparatus can generally be used for thermal processing such as annealing processing, oxide film-forming processing, diffusion processing and film-forming processing.

Although a case in which a batch-type vertical hot wall CVD apparatus is used has been explained in the above-mentioned embodiments, the present invention can also be applied to a semiconductor device producing apparatus, such as a batch-type vertical hot wall thermal processing apparatus.

Although wafers are thermally processed in the above embodiment, a subject to be processed may be a photomask, a printed wiring substrate, a liquid crystal panel, a compact disk, a magnetic disk or the like.

The entire disclosure of Japanese Patent Application No. 2002-266585 filed on Sep. 12, 2002 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A semiconductor device producing apparatus, comprising:
   a carrier-holding stage for placing a carrier for accommodating a substrate or substrates;
   a processing chamber for thermal processing the substrate or the substrates therein;
   a first boat holder for holding first and second boats one at a time which are capable of respectively holding the substrate or the substrates and for moving the first and second boats one at a time into and out from said processing chamber, wherein said first boat holder is located directly below said processing chamber, and said first boat holder moves vertically to move the first and second boats one at a time into and out from said processing chamber;
   a second boat holder for holding the first and second boats one at a time in standby, said second boat holder not being located directly below said processing chamber in contrast to said first boat holder;
   a third boat holder for holding the first and second boats one at a time for cooling the substrate or the substrates after thermal processing in the processing chamber, said third boat holder not being located directly below said processing chamber in contrast to said first boat holder;
   a boat transfer mechanism which transfers the first and second boats between said first, second and third boat holders, said boat transfer mechanism including a linear actuator disposed in parallel to a line connecting a center of said second boat holder and a center of said first boat holder to transfer the first and second boats one at a time at least from said second boat holder to said first boat holder;
   a substrate transfer mechanism which transfers the substrate or substrates directly from the carrier placed at said carrier-holding stage directly to either one of the first and second boats, said substrate transfer mechanism being located at a position which allows the substrate or substrates to be transferred from the carrier placed at the carrier-holding stage to either one of said first and second boats held by said first boat holder; and
   a controller which controls said first boat holder, said boat transfer mechanism and said substrate transfer mechanism for said boat transfer mechanism to transfer one of the first and second boats from said second boat holder to said first boat holder, for said substrate transfer mechanism to thereafter transfer the substrate or the substrates from the carrier held at said carrier-holding stage to said one of the first and second boats held by said first boat holder, and for said first boat holder thereafter to move said one of the first and second boats into said processing chamber to process the substrate or the substrates in said processing chamber.

2. A semiconductor device producing apparatus as recited in claim 1, wherein said boat transfer mechanism further includes a second linear actuator disposed in parallel to a line connecting the center of said first boat holder and a center of said third boat holder to transfer the first and second boats one at a time at least from said first boat holder to said third boat holder;

said controller controls said first boat holder, said boat transfer mechanism and said substrate transfer mechanism, before the transfer of said one of the first and second boats from said second boat holder to said first boat holder, for said boat transfer mechanism to transfer the other of the first and second boats from said first boat holder to said third boat holder.

3. A semiconductor device producing apparatus as recited in claim 2, wherein said controller controls said first boat holder, said boat transfer mechanism and said substrate transfer mechanism before the transfer of the other of the first and second boats from said first boat holder to said third boat holder, for said first boat holder to move the other of the first and second boats out from said processing chamber.

4. A semiconductor producing apparatus as recited in claim 2, wherein said boat transfer mechanism further includes a third linear actuator disposed in parallel to a line connecting the center of said third boat holder and the center of said second boat holder to transfer the first and second boats one at a time at least from said third boat holder to said second boat holder.

5. A semiconductor device producing apparatus as recited in claim 1, wherein the substrates are processed in said processing chamber and the first and second boats are respectively to hold the substrates.

6. A semiconductor device producing apparatus as recited in claim 1, wherein said semiconductor device producing apparatus is a batch-type semiconductor device producing apparatus.

7. A producing method of a semiconductor device, comprising processing a substrate or the substrates using the semiconductor device producing apparatus as recited in claim 1.

8. A producing method of a semiconductor device, comprising:

thermal processing a first substrate or first substrates held by a first boat in a processing chamber;

moving, after processing the first substrate or the first substrates, said first boat holding said first substrate or the substrates out from said processing chamber by a first boat holder;

transferring said first boat holding said first substrate or the substrates from said first boat holder to a second boat holder, only said first boat holder being located directly below said processing chamber;

transferring a second boat from a third boat holder to said first boat holder parallel to a line connecting a center of said third boat holder and a center of said first boat holder;

charging a second substrate or second substrates directly to said second boat held directly below said processing chamber by said first boat holder, wherein the first boat holder is located directly below the processing chamber and moves vertically to move the first and second boats one at a time into and out from the processing chamber;

moving said second boat charged with the second substrate or the second substrates into said processing chamber by said first boat holder; and processing the second substrate or the second substrates held by said second boat in said processing chamber.

9. A producing method of a semiconductor device as recited in claim 8, wherein said second boat is transferred from said second boat holder to said third boat holder parallel to a line connecting a center of said second boat holder and the center of said third boat holder, before said first boat is transferred from said first boat holder to said second boat holder.

10. A producing method of a semiconductor device as recited in claim 9, further comprising discharging the first substrate or the first substrates from said first boat placed at said third boat holder.

11. A producing method of a semiconductor device as recited in claim 8, wherein said first boat is transferred from said first boat holder to said second boat holder parallel to a line connecting the center of said first boat holder and a center of said second boat holder, before said second boat is transferred from said third boat holder to said first boat holder.

* * * * *